United States Patent
Ashby et al.

[11] Patent Number: 6,114,912
[45] Date of Patent: Sep. 5, 2000

[54] INTEGRATED AMPLIFIER HAVING A VOLTAGE-CONTROLLED CURRENT SOURCE

[75] Inventors: Kirk B. Ashby; Paul C. Davis, both of Muhlenberg Township, Berks County; Malcolm H. Smith, Macungie; Michael D. Womac, Blandon, all of Pa.

[73] Assignee: Lucent Technologies Inc., Murray Hill, N.J.

[21] Appl. No.: 09/298,048

[22] Filed: Apr. 22, 1999

[51] Int. Cl.[7] .................................................... H03F 3/04
[52] U.S. Cl. ........................................ 330/296; 327/530
[58] Field of Search .................... 330/296, 285; 327/530

[56] References Cited

U.S. PATENT DOCUMENTS

| 4,042,889 | 8/1977 | Baker .................................... 330/296 |
| 5,654,672 | 8/1997 | Bailey et al. ......................... 330/296 |
| 5,760,651 | 6/1998 | Wong .................................... 330/296 |

OTHER PUBLICATIONS

"An Integrated Silicon Bipolar Receiver Subsystem for 900 MHz ISM Band Applications," by Jeff Durec, IEEE BCTM 3.2, Sep 28–30, 1997, pp. 57–60.

"A 2.7–5.5V 0.2–1W BiCMOS RF Driver Amplifier IC with Closed–loop Power Control and Biasing," by S. Wong, S. Luo, and L. Hadley, IEEE ISSCC 98, Session 3, Transceivers and Power Amplifiers/ Paper TP 3.5, Feb. 5, 1998, pp. 52–53.

"High–Frequency Nonlinearity Analysis of Common–Emitter and Differential–Pair Transconductance Stages," by Ken Leong Fong and Robert G. Meyer, IEEE Journal f Solid–State Circuits, vol. 33, No. 4, Apr. 1998, pp. 548–555.

*Primary Examiner*—Robert Pascal
*Assistant Examiner*—Khanh Van Nguyen
*Attorney, Agent, or Firm*—Steve Mendelsohn

[57] ABSTRACT

The voltage-controlled current source receives a control voltage from an operational amplifier which itself receives a reference voltage at one input from a bias circuit. The voltage-controlled current source applies current to the base of the amplifier's main transistor. The base of the transistor is also coupled to the input node of the amplifier through a DC-blocking capacitor and through a feedback loop to the other input of the operational amplifier. The voltage-controlled current source operates to maintain the voltage at the base of the transistor relatively constant for a wide range of input signal levels. As a result, the amplifier is able to operate at relatively low power supply voltages (e.g., as low as 2V) without suffering from premature gain compression at relatively high input signal levels (e.g., as high as 0.4V).

14 Claims, 5 Drawing Sheets

INTEGRATED AMPLIFIER HAVING A VOLTAGE-CONTROLLED CURRENT SOURCE

BACKGROUND OF THE INVENTION

1. Field of the Invention

The present invention relates to integrated circuits, and, in particular, to low-noise amplifiers.

2. Description of the Related Art

As power becomes more important for integrated transceivers, lower power supply voltages will be used. As a result of this trend, many problems surface. When designing low-noise amplifier (LNA) circuits, maintaining linearity in the presence of a large signal is particularly difficult with ever shrinking power supply voltages. In order to maintain linearity, one must allow the bias to provide a constant voltage to the device regardless of the current required to maintain that voltage. For discrete LNAs, this problem has been solved simply by using a large inductor to provide bias from the power supply. This approach, however, is not easily done with integrated circuit LNAs. The primary reason for this difficulty is that large inductors require large amounts of area and are therefore very expensive to make.

FIG. 1 shows a schematic diagram of a prior-art LNA. In this figure, the bias currents are defined by all capital letters and the ac signal currents are defined by lower case letters. The emitter current $I_e$ is the sum of the bias current $I_{BIAS}$, the ac signal base current $i_b$, the average collector current $I_C$, and the ac signal collector current $i_c$, where $I_C$ is defined as Beta*$I_{BIAS}$, $i_c$ is defined as Beta*$i_b$, and Beta is defined as the low-frequency current gain.

FIG. 2 shows a graphical representation of the base voltage (in volts) at transistor B11 of FIG. 1 as a function of time (in nanoseconds) for input signals having different amplitudes (i.e., 0.001V, 0.101V, 0.201V, 0.301V, and 0.401V) at a power supply voltage $V_{CC}$ of 2.7V. As can be seen from FIG. 2, as the input signal level increases, the average base voltage decreases. This is caused by a limited $I_{BIAS}$. The average base voltage is a function of the average available current at the base. As the signal level increases, the result is a demand for more average bias current $I_{BIAS}$. This demand for a higher $I_{BIAS}$ is due to the requirement that transistor B11 must maintain a constant gain. To maintain a constant gain for an increasing input signal, transistor B11 must have an increasing average collector current $I_C$. Since the average base current is directly proportional to the average collector current, more $I_{BIAS}$ is required. As a result, the constant current source is unable to meet the demand of average base current for large input signals, the steady-state base voltage decreases, and the device experiences premature gain compression.

In addition to this gain compression problem, circuits are often required to operate from low supply voltages. Typically, a certain minimum voltage is required in order to bias a circuit for proper operation. As supply voltage decreases, the available voltage approaches or, in some cases, drops below the minimum voltage needed to bias the circuit.

Furthermore, for LNA circuits, noise immunity is very important. If noise from the bias circuit enters into the LNA the performance of the LNA is compromised. Without due consideration and proper circuit techniques, attempts to improve bias problems impact the primary function of the LNA.

FIG. 3 shows a schematic diagram of a traditional LNA bias implementation that illustrates a simple solution that will increase linearity a small amount. This is a simple voltage drive circuit similar to an inductor with the exception of not having a low output impedance at low frequencies. The circuit suffers from the problem of having a high output impedance at low frequencies, which causes linearity problems as previously discussed by K. L. Fong and R. G. Meyer, "High-Frequency Nonlinearity Analysis of Common-Emitter and Differential-Pair Transconductance Stages," IEEE Journal of Solid State Circuits, April 1998, pp. 548–555, and by J. Durec, "An Integrated Silicon Bipolar Receiver Subsystem for 900 MHZ ISM Band Application," 1997 BCTM Conference Proceedings, October 1997, pp. 57–60. Moreover, large values of resistance R32 are required to provide high RF impedances to isolate the LNA from the bias circuit which provides noise immunity from the bias circuits. Because R32 must be large, a subsequent large voltage drop occurs across R32, which decreases the base-to-emitter voltage VBE of transistor B31 and therefore results in premature compression.

FIG. 4 shows a schematic diagram illustrating the basic concept for other prior-art amplifiers, which have good linearity. See J. Durec, "An Integrated Silicon Bipolar Receiver Subsystem for 900 MHz ISM Band Application," 1997 BCTM Conference Proceedings, October 1997, pp. 57–60, and S. Wong, S. Luo, and L. Hadley, "A 2.7–5.5V 0.2–1W BiCMOS RF Driver Amplifier IC with Closed-loop Power Control and Biasing," 1998 ISSCC Digest of Technical Papers, Feb. 1998, pp. 52–53. In these solutions, there is no filtering to provide noise immunity from the bias circuits. Also, there is nothing addressing headroom problems. The typical output impedance of a low output impedance operational amplifier can only maintain output current to within one $V_{be}$ from the positive voltage supply. In this configuration, the resistor $R_{set}$ is used to determine the amount of power the device can handle. By selecting different values of $R_{set}$, different amounts of power can be handled by the amplifier B41.

SUMMARY OF THE INVENTION

The present invention is directed to a bias scheme for efficiently implementing low-noise amplifiers in integrated circuitry. The bias scheme for capacitively coupled LNAs incorporates a low-voltage low-pass-filtering feedback loop to correct decreasing DC bias voltage shift to provide linearity in the presence of large signals. The present invention addresses the mechanism that causes gain compression to occur by using a voltage-controlled current source that can provide adequate current to meet the demand of the average DC-current dependence upon signal level. The present invention has the added benefit to work with lower power supply voltages and can also operate within 100 mV of the positive supply which enables the circuit to meet the demand with ever shrinking power supplies. Finally, this invention filters the noise effects of an operational amplifier used in the feedback loop to minimize noise impact upon the LNA.

In one embodiment, the present invention is an integrated circuit having an amplifier with an input node and an output node. The amplifier comprises (a) a transistor coupled to the output node of the amplifier; (b) a capacitor coupled between a base of the transistor and the input node of the amplifier; and (c) a voltage-controlled current source circuit coupled at a first input to a bias circuit to receive a reference voltage, coupled at a second input to the base of the transistor to receive a feedback voltage, and coupled at an output to supply a current to the base of the transistor. The voltage-controlled current source circuit tends to maintain a constant voltage at the base of the transistor.

The present invention addresses the problem discussed by J. Durec and by K. L. Fong and R. G. Meyer. The voltage-controlled current source delivers essentially all of its current into the base of the LNA, which is controlled by the feedback loop. The current source allows a minimum number of poles within the feedback loop, thereby making it easier to stabilize the loop. Implementing the present invention with high output impedance amplifiers allows use with low power supplies. The present invention provides built-in noise filtering capabilities within the feedback loop.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 5:
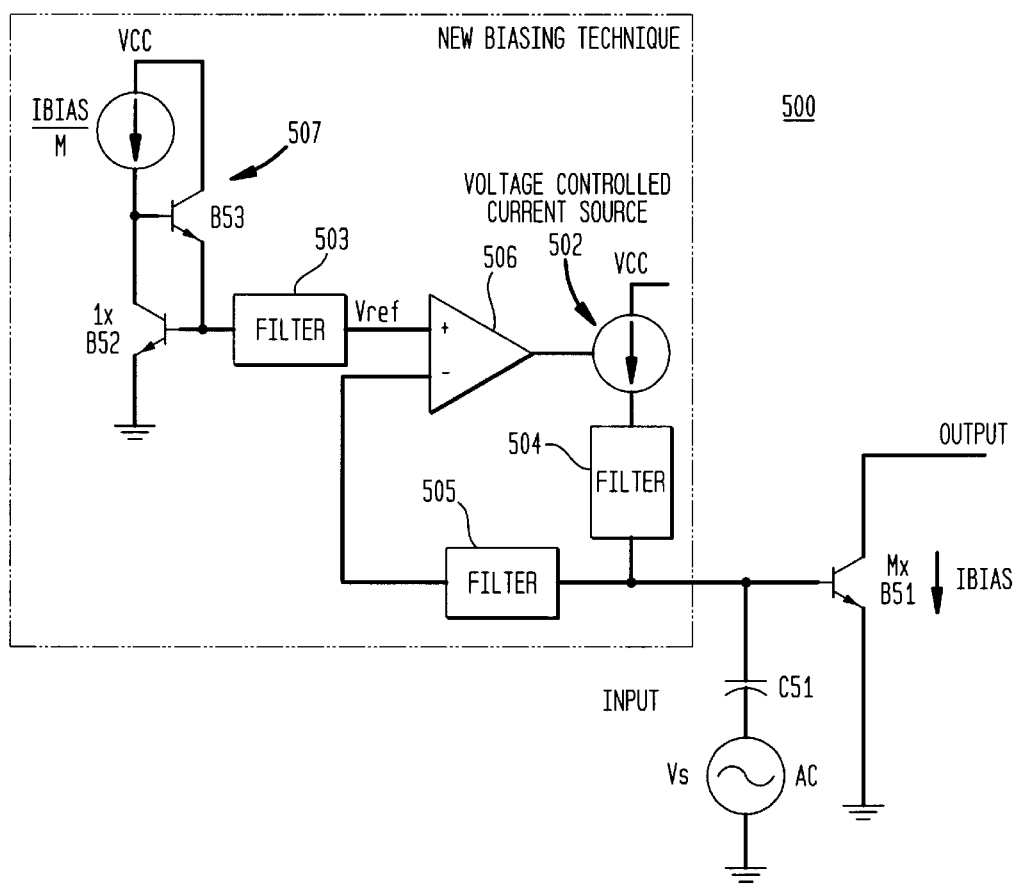
FIG. 5 shows a schematic diagram of a low-noise amplifier, according to one embodiment of the present invention.

FIG. 5 shows a schematic diagram of a low-noise amplifier 500, according to one embodiment of the present invention. LNA 500 uses feedback through a voltage-controlled current source 502 to maintain a relatively constant voltage at the base of transistor B51 for a wide range of input signal levels. In particular, bias circuit 507 supplies a constant reference voltage $V_{ref}$ to one input of an operational amplifier 506 (preferably differential type with very high gain). The output of op-amp 506 is the control voltage for current source 502, which supplies current at the base of transistor B51. The voltage at the base of transistor B51 is applied to the other input of op-amp 506 as a feedback signal, which drives op-amp 506 to control current source 502 to maintain the base voltage of transistor B51 at a constant level. Low-pass filtering (503, 504, and 505) is applied between bias circuit 507 and op-amp 506 as well as in the feedback loop.

When an input signal $V_s$ is applied to LNA 500, LNA 500 amplifies the signal by the ratio of the output load impedance to the total emitter impedance. LNA 500 is designed such that the transistor adds minimal noise to the incoming signal. LNA 500 should also provide linear gain independent of the input signal level.

Figure 1:
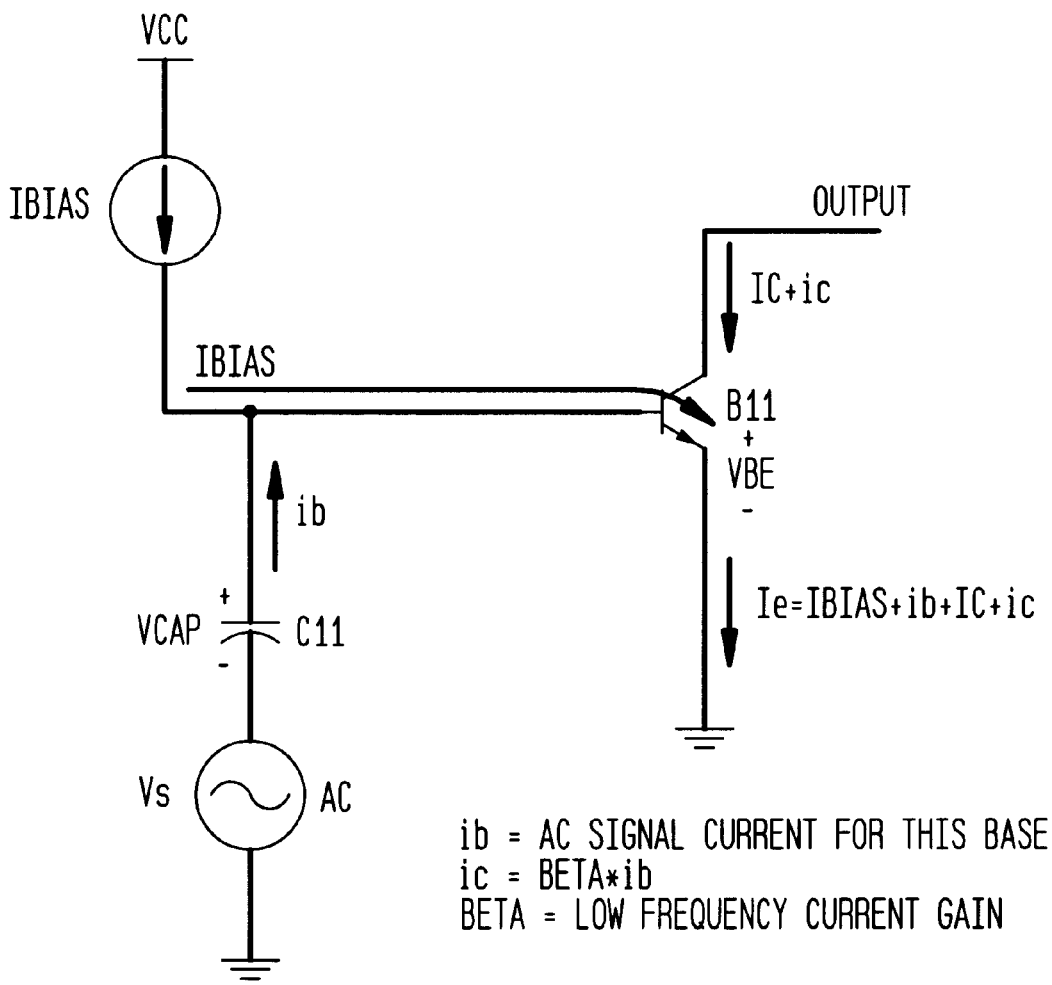
FIG. 1 shows a schematic diagram of a prior-art low-noise amplifier.
Figure 2:
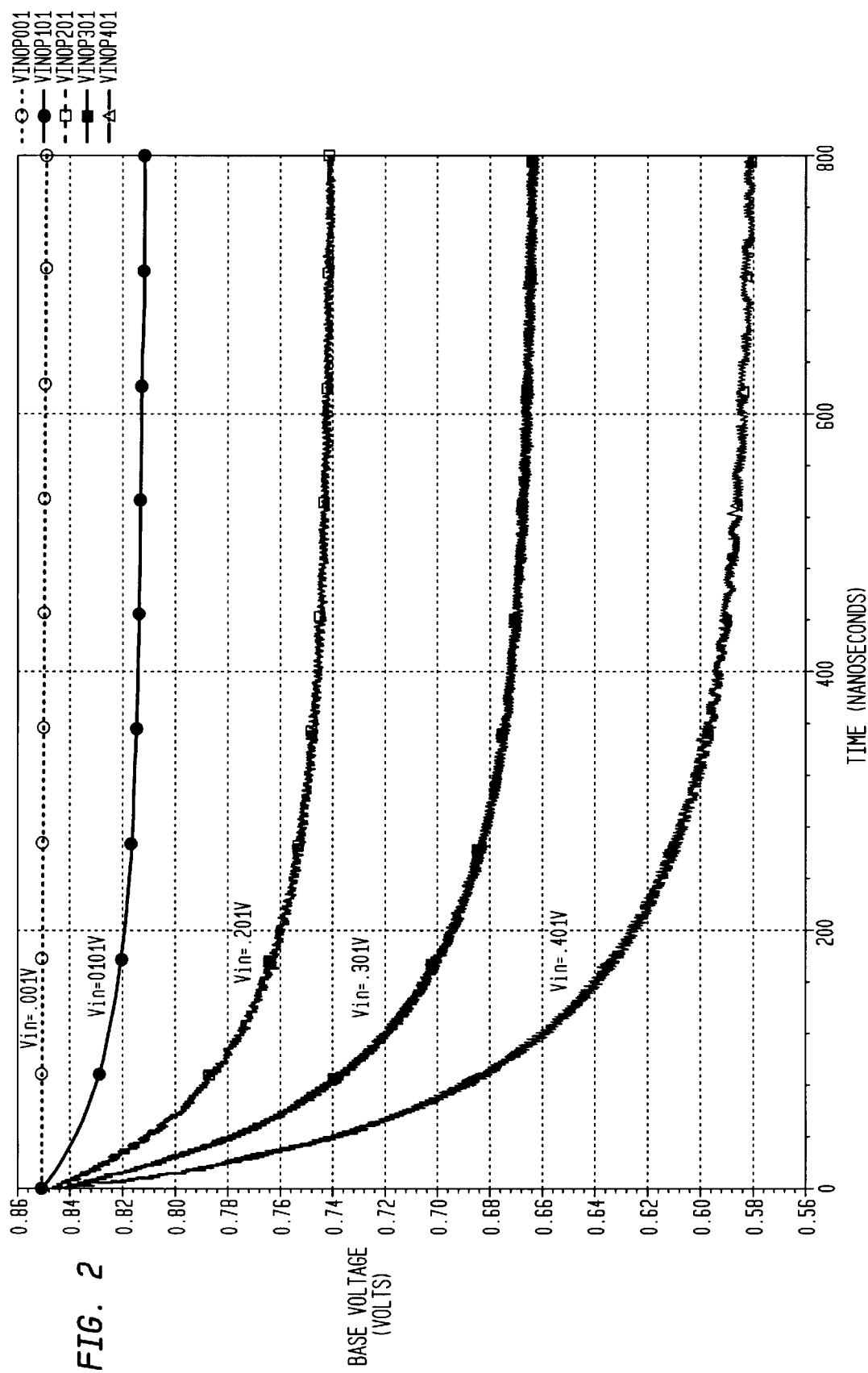
FIG. 2 shows a graphical representation of the base voltage of transistor B11 in FIG. 1 vs. time for different input signal levels for a constant current source bias.
Figure 3:
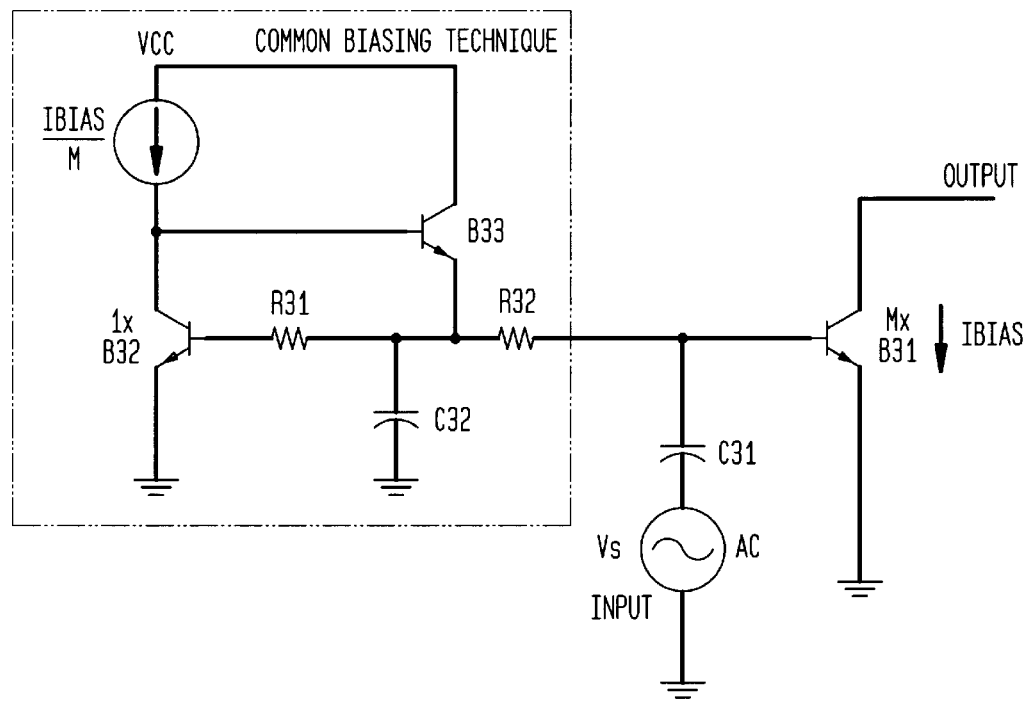
FIG. 3 shows a schematic diagram of a traditional LNA bias implementation that illustrates a simple solution to the problem of premature gain compression.
Figure 4:
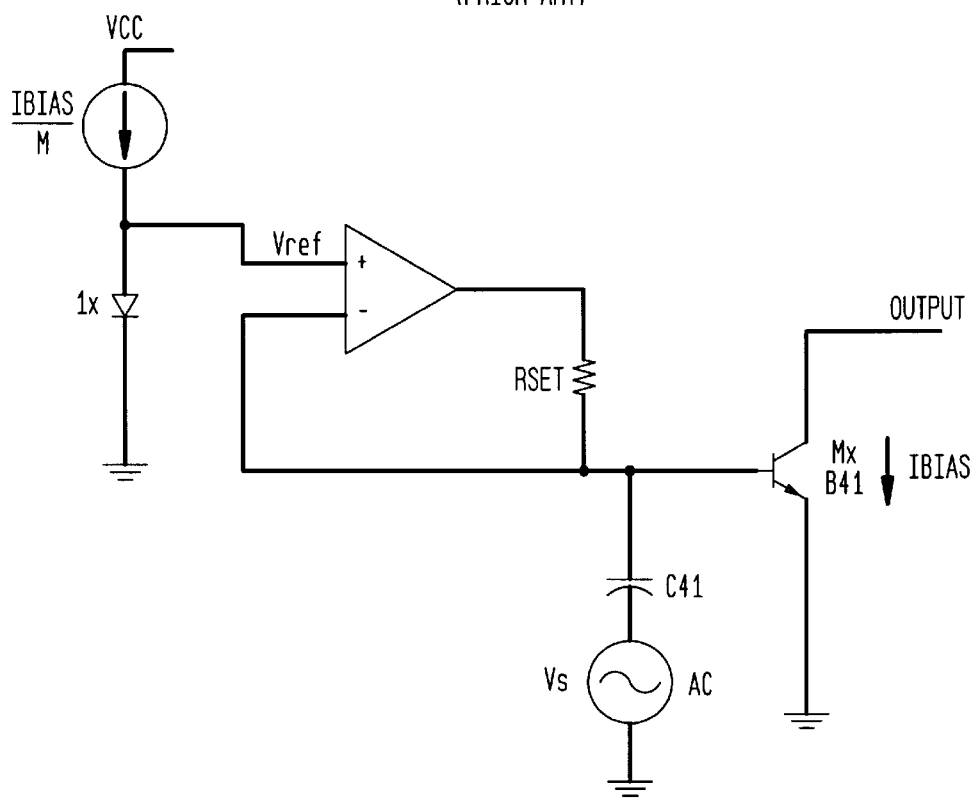
FIG. 4 shows a schematic diagram illustrating the basic concept for other prior-art LNAs, which have good linearity but do not treat issues for low noise considerations and low power supply issues.

The closest known solution of FIG. 4 uses feedback with a voltage-controlled voltage source which effects the ability of the LNA to address problems related to low supply voltages and noise immunity. The present invention allows transistor B51 to operate with linear gain as does the solution in FIG. 4 but with the added benefit of lower supply voltages and noise immunity.

Figure 6:
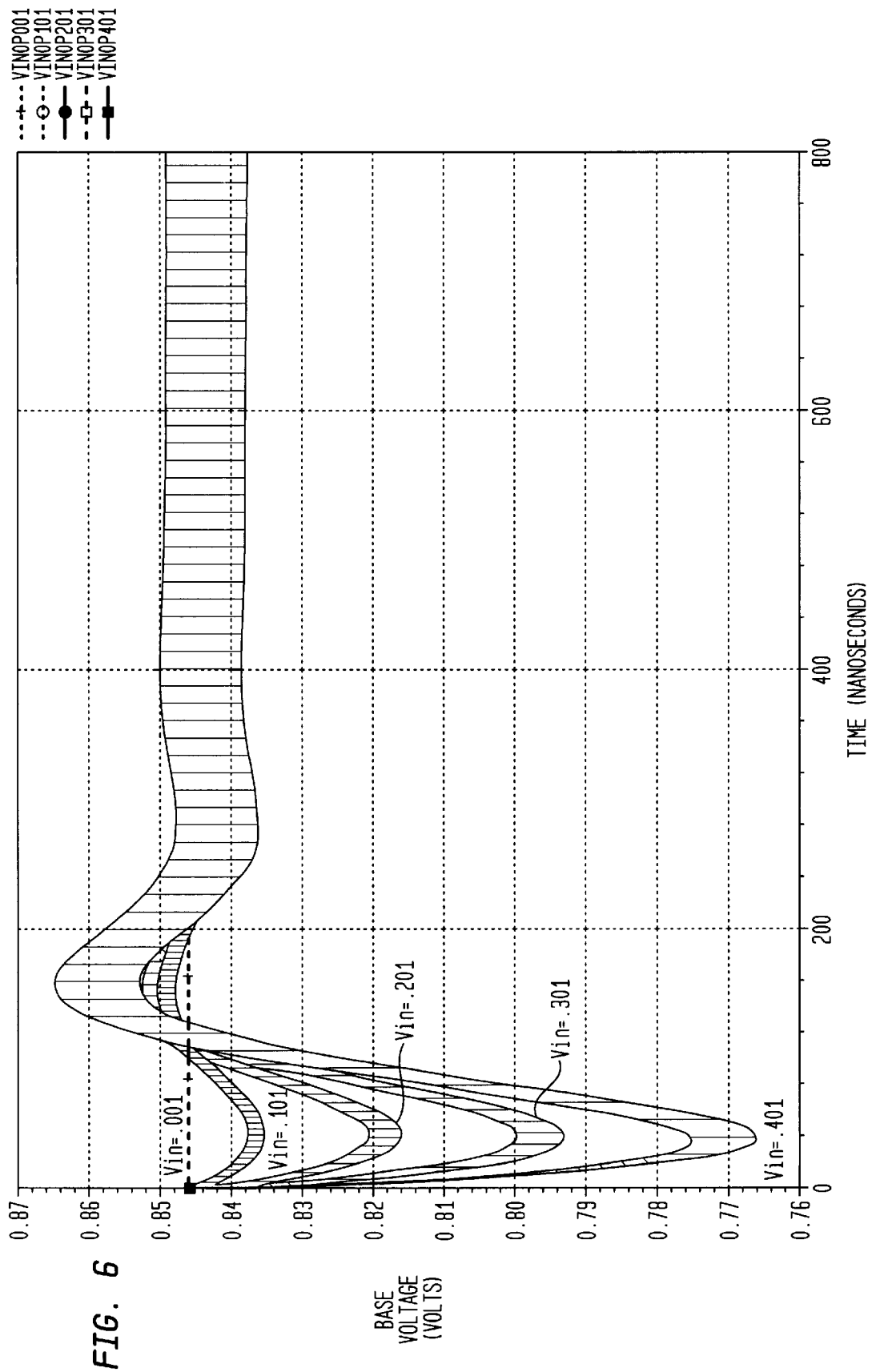
FIG. 6 shows a graphical representation of the base voltage of transistor B51 in FIG. 5 vs. time for different input signal levels for a constant voltage source bias.

FIG. 6 shows a graphical representation of the base voltage of transistor B51 in FIG. 5 vs. time for different input signal levels for a constant voltage source bias and a power supply voltage $V_{CC}$ of 2.7V. As shown in FIG. 6, after a relatively short settling time, the base voltage of transistor B51 remains relatively constant over a wide range of input signal levels.

By using a voltage-controlled current source in the feedback topology, the present invention increases headroom by allowing operation to within 100 mV of the voltage supply. This circuit can operate with a power supply voltage of less than 2 volts. The margin gained by using this method also greatly helps the linearity of the LNA at extreme operating temperature conditions. The present invention also has the added benefit of decreasing the impact of semiconductor process variations for resistors by the increased headroom which is of great concern for this application. This invention can typically increase the 1 dB compression point by as much as 15 dB.

The present invention also addresses noise immunity issues from the bias circuit by providing low-pass filtering at the appropriate points (i.e., 503, 504, and 505) which will buffer the LNA from the bias circuit noise. Using the voltage-controlled current source topology in the feedback loop also allows part of the filtering to be used to help compensate the feedback loop for stability. Because the feedback loop is a minimum 4-pole feedback loop, stability is a large concern. Voltage-controlled voltage source topologies of the prior art could have four-pole feedback loops but have serious headroom problems. In addition, the voltage-controlled voltage source feedback loop configurations of the prior art can not allow their stability compensation to aid in filtering for noise immunity because of the location of the compensation capacitor. Thus, this will make stability compensation in the prior art even more difficult.

With the voltage-controlled current source feedback topology of the present invention, a high impedance operational amplifier 506 can be used. This allows the use of a 2-pole operational amplifier. The third and fourth poles are then added with the addition of the current source 502. With 4 poles in the feedback loop, one must compensate the feedback loop to ensure stability. Because this topology has been chosen, the compensation can be an aid to the noise filtering used to provide noise immunity to the LNA from the bias circuit 507.

Although the invention has been described in the context of bipolar devices, it will be understood that the present invention may also be able to be implemented using other devices, such as CMOS devices, in which case, the terms base, collector, and emitter are understood to refer to the gate, source, and drain of a CMOS transistor, respectively. Furthermore, the configuration of bias circuit 507 is just one way of generating a reference voltage of op-amp 506; other suitable configurations are also possible. In addition, the low-pass filtering of one or more of filters 503, 504, and 505 is optional.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit having an amplifier with an input node and an output node, the amplifier comprising:
   (a) a transistor coupled to the output node of the amplifier;
   (b) a capacitor coupled between a base of the transistor and the input node of the amplifier; and
   (c) a voltage-controlled current source circuit coupled at a first input to a bias circuit to receive a reference voltage, coupled at a second input to the base of the transistor to receive a feedback voltage, and coupled at an output to supply a current to the base of the transistor, wherein the voltage-controlled current source circuit tends to maintain a constant voltage at the base of the transistor.

2. The invention of claim 1, wherein the voltage-controlled current source circuit comprises an operational amplifier coupled at an output to supply a control voltage to a voltage-controlled current source, wherein a first input of the operational amplifier is coupled to the bias circuit to receive the reference voltage and a second input of the operational amplifier is coupled to the base of the transistor to receive the feedback voltage.

3. The invention of claim 1, wherein the bias circuit is coupled to the first input of the voltage-controlled current source circuit through a first low-pass filter.

4. The invention of claim 3, wherein:
   the output of the voltage-controlled current source circuit is coupled to the base of the transistor through a second low-pass filter; and
   the base of the transistor is coupled to the second input of the voltage-controlled current source circuit through a third low-pass filter.

5. The invention of claim 1, wherein the output of the voltage-controlled current source circuit is coupled to the base of the transistor through a second low-pass filter.

6. The invention of claim 1, wherein the base of the transistor is coupled to the second input of the voltage-controlled current source circuit through a third low-pass filter.

7. The invention of claim 1, wherein:
   the voltage-controlled current source circuit comprises an operational amplifier coupled at an output to supply a control voltage to a voltage-controlled current source, wherein a first input of the operational amplifier is coupled to the bias circuit to receive the reference voltage and a second input of the operational amplifier is coupled to the base of the transistor to receive the feedback voltage;
   the bias circuit is coupled to the first input of the voltage-controlled current source circuit through a first low-pass filter;
   the output of the voltage-controlled current source circuit is coupled to the base of the transistor through a second low-pass filter;
   the base of the transistor is coupled to the second input of the voltage-controlled current source circuit through a third low-pass filter;
   the bias circuit comprises a bias current source and first and second bias transistors, wherein:
      an output of the bias current source is coupled to the base of the first bias transistor and the collector of the second bias transistor; and
      the emitter of the first bias transistor is coupled to the base of the second bias transistor and to the first input of the voltage-controlled current source circuit.

8. An integrated circuit having an amplifier with an input node and an output node, the amplifier comprising:
   (a) a transistor coupled to the output node of the amplifier;
   (b) a capacitor coupled between a base of the transistor and the input node of the amplifier; and
   (c) a voltage-controlled current source circuit coupled at a first input to a bias circuit to receive a reference voltage, coupled at a second input to the base of the transistor to receive a feedback voltage, and coupled at an output to supply a current to the base of the transistor, wherein the voltage-controlled current source circuit tends to maintain a constant voltage at the base of the transistor, wherein the bias circuit comprises a bias current source and first and second bias transistors, wherein:
      an output of the bias current source is coupled to the base of the first bias transistor and the collector of the second bias transistor; and
      the emitter of the first bias transistor is coupled to the base of the second bias transistor and to the first input of the voltage-controlled current source circuit.

9. The invention of claim 8, wherein the voltage-controlled current source circuit comprises an operational amplifier coupled at an output to supply a control voltage to a voltage-controlled current source, wherein a first input of the operational amplifier is coupled to the bias circuit to receive the reference voltage and a second input of the operational amplifier is coupled to the base of the transistor to receive the feedback voltage.

10. The invention of claim 8, wherein the bias circuit is coupled to the first input of the voltage-controlled current source circuit through a first low-pass filter.

11. The invention of claim 10, wherein:
    the output of the voltage-controlled current source circuit is coupled to the base of the transistor through a second low-pass filter; and
    the base of the transistor is coupled to the second input of the voltage-controlled current source circuit through a third low-pass filter.

12. The invention of claim 8, wherein the output of the voltage-controlled current source circuit is coupled to the base of the transistor through a second low-pass filter.

13. The invention of claim 8, wherein the base of the transistor is coupled to the second input of the voltage-controlled current source circuit through a third low-pass filter.

14. The invention of claim 8, wherein:
    the voltage-controlled current source circuit comprises an operational amplifier coupled at an output to supply a control voltage to a voltage-controlled current source, wherein a first input of the operational amplifier is coupled to the bias circuit to receive the reference voltage and a second input of the operational amplifier is coupled to the base of the transistor to receive the feedback voltage;
    the bias circuit is coupled to the first input of the voltage-controlled current source circuit through a first low-pass filter;
    the output of the voltage-controlled current source circuit is coupled to the base of the transistor through a second low-pass filter; and
    the base of the transistor is coupled to the second input of the voltage-controlled current source circuit through a third low-pass filter.

* * * * *